US011618852B2

(12) United States Patent
Lieberman et al.

(10) Patent No.: US 11,618,852 B2
(45) Date of Patent: Apr. 4, 2023

(54) CROSSLINKED LIGANDS (71) Applicant: Merck Patent GmbH, Darmstadt (DE)

(72) Inventors: Itai Lieberman, Dreieich (DE); Christian Matuschek, Frankfurt Am Main (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 17/052,309

(22) PCT Filed: Apr. 30, 2019

(86) PCT No.: PCT/EP2019/060995
§ 371 (c)(1),
(2) Date: Nov. 2, 2020

(87) PCT Pub. No.: WO2019/211257
PCT Pub. Date: Nov. 7, 2019

(65) Prior Publication Data
US 2021/0163817 A1  Jun. 3, 2021

(30) Foreign Application Priority Data

May 3, 2018  (EP) .................................... 18170479

(51) Int. Cl.
| C09K 11/02 | (2006.01) |
| H01L 51/00 | (2006.01) |
| B82Y 20/00 | (2011.01) |
| B82Y 40/00 | (2011.01) |
| H01L 51/50 | (2006.01) |

(52) U.S. Cl.
CPC .......... C09K 11/025 (2013.01); H01L 51/005 (2013.01); B82Y 20/00 (2013.01); B82Y 40/00 (2013.01); H01L 51/502 (2013.01)

(58) Field of Classification Search
CPC ........ C09K 11/025; B82Y 20/00; B82Y 40/00
See application file for complete search history.

(56) References Cited

U.S. PATENT DOCUMENTS

| 7,151,047 | B2 | 12/2006 | Chan et al. |
| 8,221,651 | B2 | 7/2012 | Murase et al. |
| 8,394,976 | B2 * | 3/2013 | Pickett ................... B82Y 30/00 556/9 |
| 8,597,730 | B2 * | 12/2013 | Pickett ................... B82Y 30/00 427/214 |
| 8,901,333 | B2 * | 12/2014 | Tulsky ................. C09K 11/025 556/19 |
| 9,115,097 | B2 | 8/2015 | Naasani |
| 9,840,664 | B2 | 12/2017 | Naasani |
| 10,224,483 | B2 | 3/2019 | Li et al. |
| 10,246,634 | B2 | 4/2019 | Yang et al. |
| 2004/0091710 | A1 * | 5/2004 | Bawendi ................... C01G 9/08 428/407 |
| 2010/0068522 | A1 | 3/2010 | Pickett et al. |
| 2010/0113813 | A1 | 5/2010 | Pickett et al. |
| 2011/0281388 | A1 | 11/2011 | Gough et al. |
| 2017/0183567 | A1 * | 6/2017 | Zhou ....................... G03F 7/105 |

FOREIGN PATENT DOCUMENTS

| EP | 3163372 B1 | 4/2020 |
| WO | 14181245 A1 | 11/2014 |

OTHER PUBLICATIONS

International Search Report PCT/EP2019/060995 dated Aug. 20, 2019 (pp. 1-4).
Götz et al., "Visible-Light Photocatalyzed Cross-Linking of Diacetylene Ligands by Quantum Dots to Improve Their Aqueous Colloidal Stability"; J. Phys. Chem. B 2014, 118, 14103-14109.
Zhang et al., "Compact PEGylated polymer-caged Quantum dots with improved stability"; Colloids and Surfaces A: Physicochem. Eng Aspects 402 (2012) 72-79.
Musoy et al., "Aqueous Synthesis of PEGylated Quantum Dots with Increased Colloidal Stability and Reduced Cytotoxicity" Bioconjugate Chemistry, 2016, 27, 414-426.
Aldakov et al., Mercaptophosphonic acids as efficient linkers in quantum dot sensitized solar cells; J. Mater. Chem. A, 2015, 3, 19050-19060.

* cited by examiner

Primary Examiner — C Melissa Koslow
(74) Attorney, Agent, or Firm — Millen, White, Zelano and Branigan, P.C.; Harry B. Shubin (57) ABSTRACT The present invention relates to a semiconducting light emitting nanoparticle comprising a polymeric layer.

14 Claims, 4 Drawing Sheets

CROSSLINKED LIGANDS

FIELD OF THE INVENTION

The present invention relates to a semiconducting light emitting nanoparticle comprising a polymeric outer layer and to a method for preparing said semiconducting light emitting nanoparticle. Further, the present invention relates to a composition and a formulation comprising at least said semiconducting light emitting nanoparticle, and to the use of said semiconducting light emitting nanoparticle in an optical device.

BACKGROUND OF THE INVENTION

Semiconducting light emitting nanoparticles are of great interest for use as color converter materials in optical devices due to their narrow fluorescence emission.

For example, US 2010/068522 A1 presents synthesis of Quantum Dots (hear after QDs) with ligands that are comprised from a non-saturated group at its end. The cross-linking concept described in the patent application requires catalytic process for cross linking of double bonds.

US 2011/281388A describes a cross linking of QDs in a solid state, after the QDs solution was spin coated on a glass substrate. In this case the cross linking is done to prevent re-dissolving of the first layer of the spin coated QDs by a second layer to be deposited on the first layer.

U.S. Pat. Nos. 9,115,097 B2, and 9,840,664 B2 describe that a cross linking of the ligands was done by adding a cross linking agent.

In201747022708 mentions a cross linking of QD to QD each having a different kind of ligand, which can react with each other, or use of a cross linking agent. Also, the crosslinking was done on a solid phase.

*Colloids and Surfaces A: Physicochem. Eng. Aspects* 402 (2012) 72-79 discloses a cross linking of glutathione with bifunctional PED as a cross linking agent.

U.S. Pat. No. 7,151,047 B2 discloses a cross linking of mercaptoacid with a lysine as a cross linking agent.

EP 3163372A2 describes an addition of bulky ligands to the QD formulation decreases the QD effective concentration in the final product. The cross linking was done through a cross linking agent, which results in a partial protection for the QD.

*J. Phys. Chem. B* 2014, 118, 14103-14109 describes photocatalytic cross linking of mercapto diacetylenes, adsorbed to CdSe/ZnS QDs showing that the crosslinked ligands covered QDs are stable over time in polar solvent.

Using fluorescent quantum dots for applications such as down conversion layers in liquid crystal displays (LCDs), color filters in light emitting diodes (LEDs), or as emissive layer in electroluminescent devices requires the semiconducting light emitting nanoparticles to be stable under extreme conditions such as elevated heat and high light flux, and against external elements from the atmosphere or the surrounding matrix, such as oxygen, water, free radicals and free charges, passing through outer layers of the nanoparticles.

Typically, the semiconducting nanoparticles are incorporated into a thin film to provide protection for the nanocrystals. Various polymers have been used for this purpose, such as acrylates, siloxanes, silazanes, epoxies or silicones.

However, incorporating quantum dots into these kinds of layers causes a drop in their emission quantum yield (QY). This is caused by aggregation of the semiconducting nanoparticles in the solid polymer layer and due to polymerization processes, which affect the organic molecules attached to the surface of the nanoparticles (commonly known as "ligands") and cause detachment of the ligands from the surface of the nanoparticles.

Furthermore, application of polymer layers is not always possible, for example when the layer of the semiconducting nanoparticles needs to be conductive, as is the case in electroluminescent devices. In this kind of devices, the semiconducting nanoparticles are deposited as a solid layer and the surface of the nanoparticles must be protected.

Thus, there is still a need for a new concept of protecting semiconducting light emitting nanoparticles against outside elements, which overcomes one or more of the drawbacks described in the prior art.

SUMMARY OF THE INVENTION

The present invention is made in view of the problems described above, and it is therefore the object of the present invention to provide a new concept of protecting the surface of semiconducting light emitting nanoparticles against outside elements, which does not suffer from the above-described drawbacks.

The present inventors have surprisingly found that one or more of the above described problems can be solved by the features as defined in the claims.

Specifically, to solve one or more of the above described problems, the present invention provides a semiconducting light emitting nanoparticle comprising
a core,
one or more shell layers, and
at least one organic ligand A, at least one organic ligand B and at least one organic ligand C attached to the outermost surface of the shell layers, wherein
at least one organic ligand A comprises a crosslinkable functional group X,
at least one organic ligand B comprises a crosslinkable functional group Y, and
at least one organic ligand C comprises a crosslinkable functional group z,
characterized in that
groups X, Y and Z are each capable of acting as a crosslinking acceptor and as a crosslinking donator.

Further, to solve one or more of the above described problems the present invention provides a semiconducting light emitting nanoparticle comprising
a core,
one or more shell layers,
at least one organic ligand A, at least one organic ligand B and at least one organic ligand C attached to the outermost surface of the shell layers, and
a polymeric outer layer,
characterized in that
the polymeric outer layer is formed by direct linkages between the at least one organic ligand A, the at least one organic ligand B and the at least one organic ligand C through crosslinkable functional groups X, Y and Z.

One or more of the above-described problems is also solved by a method for preparing a semiconducting light emitting nanoparticle having a polymeric outer layer, the method comprising the steps of:
a) Providing a semiconducting light emitting nanoparticle comprising a core, one or more shell layers and at least one organic ligand A, at least one organic ligand B and at least one organic ligand C attached to the outermost surface of the shell layers, wherein the at least one organic ligand A comprises a crosslinkable functional group X, the at least one organic ligand B comprises a crosslinkable functional group Y and the at least one organic ligand C comprises a crosslinkable functional group Z; and b) crosslinking the at least one organic ligand A, the at least one organic ligand B and the at least one organic ligand C to form a polymeric outer layer by subjecting the nanoparticle of step a) to a condition permitting formation of direct linkages between the at least one organic ligand A, the at least one organic ligand B and the at least one organic ligand C through crosslinkable functional groups X, Y and Z.

The present invention also relates to a semiconducting light emitting nanoparticle obtainable or obtained from this method.

That is, the present inventors surprisingly found that by using as the surface attached ligands such functionalized ligands, which comprise a nanoparticle surface attaching group as well as a crosslinkable or polymerizable group, and by crosslinking the surface attached ligands themselves, a polymeric network is formed that creates a or corresponds to a polymeric outer layer surrounding the nanoparticle surface, which provides steric protection against any kind of outside elements and also prevents ligands that are detached from the surface to diffuse away, but which instead allows the detached ligands to re-attach to the surface with high probability.

Further, this protection concept advantageously does not require any additional materials, compounds or agents to be added to the semiconducting nanoparticles, and therefore allows application of highly concentrated semiconducting light emitting nanoparticle layers, thereby improving light emission output from an optoelectric device, based on a quantum material layer as the emissive element.

Further, the present invention relates to a composition comprising the semiconducting light emitting nanoparticle and to a formulation comprising the semiconducting light emitting nanoparticle or the composition and at least one solvent.

In addition, the present invention relates to the use of the semiconducting light emitting nanoparticle or the composition or the formulation in an electronic device, optical device or in a biomedical device.

The present invention also relates to an optical medium comprising the semiconducting light emitting nanoparticle or the composition.

The present invention further relates to an optical device comprising the optical medium.

Further advantages of the present invention will become evident from the following detailed description.

DETAILED DESCRIPTION OF THE INVENTION

Hereinafter, the best mode for carrying out the present invention is described in detail.

The present invention provides a semiconducting light emitting nanoparticle comprising
a core,
one or more shell layers, and
at least one organic ligand A, at least one organic ligand B and at least one organic ligand C attached to the outermost surface of the shell layers, wherein
  at least one organic ligand A comprises a crosslinkable functional group x,
  at least one organic ligand B comprises a crosslinkable functional group Y, and
  at least one organic ligand C comprises a crosslinkable functional group Z,
characterized in that
groups X, Y and Z are each capable of acting as a crosslinking acceptor and as a crosslinking donator.

According to the present invention, functional groups X, Y and Z are chemical groups which are crosslinkable or polymerizable, which terms are used interchangeably herein, that is, functional groups that provide the ability to act as a crosslinking acceptor and as a crosslinking donator and are able to be polymerized by chemical crosslinking, for example an unsaturated group such as a vinyl group, thereby forming linkages between the surface attached at least one organic ligand A, at least one organic ligand B and at least one organic ligand C around the surface of the same nanoparticle (i.e., intramolecular linkages) so that a polymeric outer layer is formed, as will be described below.

Preferably, crosslinkable functional groups X, Y and Z are terminal groups with respect to ligands A, B and C, respectively. Further preferably, each of ligands A, B and C comprises exactly one crosslinkable functional group X, Y and Z, respectively.

The ability of acting as a crosslinking acceptor and as a crosslinking donator as defined herein is understood to mean that during the chemical crosslinking reaction each of crosslinkable or polymerizable functional groups X, Y and Z is capable of being attacked by an active propagating center (representing the crosslinking acceptor) to thereby create a new propagating center, which in turn is capable of attacking another crosslinkable or polymerizable functional group (representing the crosslinking donator) to again create a new propagating center, and so on.

The form a propagating center takes depends on the specific type of polymerization mechanism, which is not limited within the present invention, as will be described below. Accordingly, without wishing to be bound by any theory, functional groups X, Y and Z are amenable to a chain-building polymerization type of reaction thereby intramolecularly crosslinking the at least three organic ligands A, B and C resulting in the formation of a polymeric net that creates a, or corresponds to a polymeric outer layer.

For example, according to the present invention group(s) X is(are) capable of acting as a crosslinking acceptor with respect to group(s) Y and as a crosslinking donator with respect to group(s) Z, and/or as a crosslinking acceptor with respect to group(s) Z and as a crosslinking donator with respect to group(s) Y; group(s) Y is(are) capable of acting as a crosslinking acceptor with respect to group(s) Z and as a crosslinking donator with respect to group(s) X, and/or as a crosslinking acceptor with respect to group(s) X and as a crosslinking donator with respect to group(s) Z; and/or group(s) Z is(are) capable of acting as a crosslinking acceptor with respect to group(s) X and as a crosslinking donator with respect to group(s) Y, and/or as a crosslinking acceptor with respect to group(s) Y and as a crosslinking donator with respect to group(s) X, without being limited thereto. For example, it may also be possible within the present invention that group(s) X is(are) capable of acting as a crosslinking acceptor and/or as a crosslinking donator with respect to (an)other group(s) X. The same applies to groups Y and Z.

According to the present invention, organic ligands A, B and C comprising crosslinkable functional groups X, Y and Z, respectively, are attached to the outermost surface of the shell layers of the nanoparticle in a concentration that allows formation of a polymeric outer layer (by crosslinking organic ligands A, B and C through functional groups X, Y and Z) that entirely surrounds the core and the one or more shell layers of the nanoparticle.

Preferably, the concentration of organic ligands of A, the concentration of organic ligands B and the concentration of organic ligands C attached to the outermost surface of the shell layers of the nanoparticle is substantially the same.

In a preferred embodiment of the present invention, the at least one organic ligand A, the at least one organic ligand B and the at least one organic ligand C are each represented by the general formula (I)

U—V—W    (I).

Within formula (I), group U is at each occurrence in the at least one organic ligand A, the at least one organic ligand B and the at least one organic ligand C, identically or differently, a nanoparticle surface attaching group that is capable of interacting or bonding with the outermost surface of the one or more shell layers. The interaction or bonding may be covalent bonding or ionic bonding, or dipole-dipole interaction, without being limited thereto.

Preferably, group U is at each occurrence in the at least one organic ligand A, the at least one organic ligand B and the at least one organic ligand C, identically or differently, selected from the group consisting of a phosphonic acid group, a thiol group, a thiolate group, a thioic acid group, a dithioic acid group, a mercaptoester group, a carboxylic acid group, a carboxylate group, in particular Zn-carboxylate, a phosphonate group, in particular Zn-phosphonate, a thiocarbamate group, in particular Zn-thiocarbamate, a phosphine group, a phosphinoxide group, an amide group, an amine group, and a selenol group. Most preferably, group U is a phosphonic acid group (—P(O)(OH)$_2$).

Within formula (I), group W represents a terminal crosslinkable functional group corresponding to crosslinkable functional groups X, Y and Z, respectively, depending on which of organic ligands A, B or C general formula (I) represents. Preferably, groups X, Y and Z are independently of each other selected from the group consisting of a thiol group, an acrylate group (—OC(O)CHCH2), a styrene group (—(C6H4)CHCH2), a carbonate group, and a carbamate, preferably urethane, group.

Within formula (I), group V is at each occurrence in the at least one organic ligand A, the at least one organic ligand B and the at least one organic ligand C, identically or differently, a linker group, that is, a chemical group connecting the nanoparticle surface attaching group U with the respective crosslinkable functional group X, Y or Z.

Preferably, linking group V is at each occurrence independently selected from the group consisting of a straight-chain alkylene group having 1 to 20 C atoms, or branched alkylene group having 3 to 20 C atoms, where one or more non-adjacent methylene structural units (—CH$_2$—) in said straight-chain and branched alkylene groups may in each case be replaced by a phenylene group, a sulfonyl group, a carbonyl group, an ether group, a sulfide group, a sulfoxide group, an ester group, a phosphoester group, an amide group or an imine group, or a straight-chain alkenylene group or alkynylene group having 2 to 20 C atoms or a branched alkenylene group or alkynylene group having 3 to 20 C atoms, where one or more methylene structural units (—CH$_2$—) in said straight-chain and branched alkenylene or alkynylene groups may in each case be replaced by a phenylene group, a sulfonyl group, a carbonyl group, an ether group, a sulfide group, a sulfoxide group, an ester group, a phosphoester group, an amide group or an imine group.

For the purposes of the present invention, a straight-chain alkylene group having 1 to 20 C atoms, a branched alkylene group having 3 to 20 C atoms, a straight-chain alkenylene or alkynylene group having 2 to 20 C atoms or a branched alkenylene or alkynylene group having 3 to 20 C atoms, in which, in addition, individual methylene structural units (—CH$_2$—) may be substituted by the groups mentioned above, is preferably taken to mean the groups methylene, ethylene, n-propylene, i-propylene, n-butylene, i-butylene, s-butylene, t-butylene, 2-methylbutylene, n-pentylene, s-pentylene, cyclopentylene, neopentylene, n-hexylene, neohexylene, n-heptylene, n-octylene, n-nonylene, n-decylene, n-undecylene, n-dodecylene, 2-ethylhexylene, ethenylene, propenylene, butenylene, pentenylene, hexenylene, heptenylene, octenylene, nonenylene, decenylene, undecenylene, dodecenylene, ethynylene, ethynylene, n-propynylene, i-propynylene, n-butynylene, i-butynylene, s-butynylene, t-butynylene, 2-methylbutynylene, n-pentynylene, s-pentynylene, cyclopentynylene, neopentynylene, n-hexynylene, neohexynylene, n-heptynylene, n-octynylene, n-nonynylene, n-decynylene, n-undecynylene, n-dodecynylene, 2-ethylhexynylene, ethenynylene, propenynylene, butenynylene, pentenynylene, hexenynylene, heptenynylene, octenynylene or nonenynylene.

Most preferably, linking group V is a straight-chain alkylene group having 1 to 20 C atoms, where one or more non-adjacent methylene structural units (—CH$_2$—) in said straight-chain alkylene group may be replaced by a phenylene group, a sulfonyl group, a carbonyl group, an ether group, a sulfide group, a sulfoxide group, an ester group, a phosphoester group, an amide group or an imine group.

In a further preferred embodiment of the present invention, group U is identical in each of the at least one organic ligand A, the at least one organic ligand B and the at least one organic ligand C and/or group V is identical in each of the at least one organic ligand A, the at least one organic ligand B and the at least one organic ligand C.

In other words, it may be preferred according to the present invention that organic ligands A, B and C are attached to the surface of the nanoparticle via identical functional groups U. Alternatively or additionally, it may be preferred according to the present invention that in organic ligands A, B and C the surface attaching group U and the respective crosslinkable function group X, Y or Z is linked via identical liking groups V.

Further preferably, in each of the at least one organic ligand A, the at least one organic ligand B and the at least one organic ligand C group U is a phosphonic acid group and group V is a straight-chain alkylene group having 1 to 20 C atoms, where one or more non-adjacent methylene structural units (—CH$_2$—) in said straight-chain alkylene group may be replaced by a phenylene group, a sulfonyl group, a carbonyl group, an ether group, a sulfide group, a sulfoxide group, an ester group, a phosphoester group, an amide group or an imine group.

In a further preferred embodiment of the present invention, crosslinkable functional groups X, Y and Z are identical, which means that organic ligands A, B and C have identical crosslinkable functional groups X, Y and Z. Accordingly, it may be preferred according to the present invention that the functional groups for crosslinking organic ligands A, B and C attached to the outermost surface of the nanoparticle, and hence for forming the polymeric outer layer, are identical.

It is further preferred according to the present invention, if the at least one organic ligand A, the at least one organic ligand B and the at least one organic ligand C are identical. This means that it may be preferred according to the present invention that organic ligands A, B and C attached to the outermost surface of the nanoparticle, which are crosslinked to form the polymeric outer layer, are identical.

Further preferably, functional groups X, Y and Z are identically selected from a thiol group, an acrylate group, and a styrene group.

In a further preferred embodiment of the present invention, the at least one organic ligand A, the at least one organic ligand B and the at least one organic ligand C are identically selected from 11-mercaptoundecylphosphonic acid, 11-phosphonoundecyl acrylate and p-[(4-ethenylphenyl)methyl] phosphonic acid.

The above-described semiconducting light emitting nanoparticle can be prepared following reaction step a) in the method as will be described below, and is obtainable or can be obtained or isolated from reaction step a) of the method as will be described below.

The present invention further provides a semiconducting light emitting nanoparticle comprising
a core,
one or more shell layers,
at least one organic ligand A, at least one organic ligand B and at least one organic ligand C attached to the outermost surface of the shell layers, and
a polymeric outer layer,
characterized in that
the polymeric outer layer is formed by direct linkages between the at least one organic ligand A, the at least one organic ligand B and the at least one organic ligand C through crosslinkable functional groups X, Y and Z.

In other words, the semiconducting light emitting nanoparticle provided by the present invention is characterized in that the at least one organic ligand A, the at least one organic ligand B and the at least one organic ligand C attached to the outermost surface of the one or more shell layers of the nanoparticle are crosslinked by direct linkages through crosslinkable functional groups X, Y and Z, thereby forming the polymeric outer layer.

For example, according to the present invention the polymeric outer layer may be formed by direct linkages of the at least one organic ligand A with at least one organic ligand B and one organic ligand C, direct linkages of the at least one organic ligand B with at least one organic ligand A and one organic ligand C, and/or direct linkages of the at least one organic ligand C with at least one organic ligand A and one organic ligand B, through crosslinkable functional groups X, Y and Z.

As mentioned above, according to the present invention the concentration of organic ligands A, B and C attached to the outermost surface of the shell layers of the nanoparticle is such that the formation of a polymeric outer layer is allowed by crosslinking organic ligands A, B and C through functional groups X, Y and Z, which layer entirely surrounds the core and the one or more shell layers of the nanoparticle.

The term "direct linkage" as used herein is understood to mean that the at least one organic ligand A, the at least one organic ligand B and the at least one organic ligand C are linked to each other as defined above through direct chemical, preferably covalent, bonding between the atoms of the respective crosslinkable or polymerizable functional groups X, Y and Z, i.e., the crosslinking reaction is performed without the use and/or incorporation of any additional linking/cross-linking agent, such as bifunctional polyethyleneglycol, melamine-based compounds such as hexamethoxymethylmelamine, dicyclohexylcarbodiimide, or of any foreign polymeric or copolymeric ligands not being attached to the surface of the nanoparticle.

The at least one organic ligand A, the at least one organic ligand B and the at least one organic ligand C, which comprise in their non-crosslinked form functional groups X, Y and Z, respectively, are as defined above.

Accordingly, in a preferred embodiment of the present invention, the at least one organic ligand A, the at least one organic ligand B and the at least one organic ligand C are each represented in its non-crosslinked form by the general formula (I)

$$U\text{—}V\text{—}W \qquad (I),$$

in which groups U, V and W are as defined above.

According to a further preferred embodiment of the present invention, group U is identical in each of the at least one organic ligand A, the at least one organic ligand B and the at least one organic ligand C and/or group V is identical in each of the at least one organic ligand A, the at least one organic ligand B and the at least one organic ligand C.

Further preferably, in each of the at least one organic ligand A, the at least one organic ligand B and the at least one organic ligand C group U is a phosphonic acid group and group V is a straight-chain alkylene group having 1 to 20 C atoms, where one or more non-adjacent methylene structural units (—CH$_2$—) in said straight-chain alkylene group may be replaced by a phenylene group, a sulfonyl group, a carbonyl group, an ether group, a sulfide group, a sulfoxide group, an ester group, a phosphoester group, an amide group or an imine group.

According to a further preferred embodiment of the present invention, crosslinkable functional groups X, Y and Z are identical in each of the at least one organic ligand A, the at least one organic ligand B and the at least one organic ligand C. Accordingly, it may be preferred according to the present invention that the direct linkages between organic ligands A, B and C attached to the outermost surface of the nanoparticle are formed through identical functional groups, thereby creating the polymeric outer layer.

According to a still further preferred embodiment of the present invention, the at least one organic ligand A, the at least one organic ligand B and the at least one organic ligand C are identical. This means that it may be preferred according to the present invention that the polymeric outer layer is formed through direct linkages of at least three identical organic ligands attached to the outermost surface of the nanoparticle.

Further preferably, functional groups X, Y and Z are identically selected from a thiol group, an acrylate group, and a styrene group.

In a further preferred embodiment of the present invention, the at least one organic ligand A, the at least one organic ligand B and the at least one organic ligand C, each in its non-crosslinked form, are identically selected from 11-mercaptoundecylphosphonic acid, 11-phosphonoundecyl acrylate and p-[(4-ethenylphenyl)methyl]phosphonic acid.

The semiconducting light emitting nanoparticle according to the present invention has a polymeric outer layer created by intramolecular self-crosslinking of surface attached ligands without the addition and/or incorporation of any (bifunctional) crosslinking agents, or foreign polymeric or copolymeric ligands.

The said polymeric outer layer formed by intramolecular self-crosslinking of the surface attached ligands prevents penetration of oxidative elements from, for example, the atmosphere or the surrounding matrix, which elements react with the ligands and cause detachment of the ligands from the nanoparticle surface.

Also, the polymeric outer layer formed by intramolecular self-crosslinking of the surface attached ligands prevents ligands that are detached from the surface to diffuse away, but instead allows the detached ligands to re-attach to the surface with high probability. By this, a drop of quantum yield of the quantum dots as a result of ligand detachment under heat and light conditions and in radical rich environments can be prevented. Instead, a better performance of the semiconducting nanoparticles and a higher stability in solution and against radical rich environments is achieved.

Semiconducting Light Emitting Nanoparticle:

According to the present invention, as an inorganic part of the semiconducting light emitting nanoparticle, a wide variety of publicly known semiconducting light emitting nanoparticles can be used as desired.

A type of shape of the semiconducting light emitting nanoparticle of the present invention is not particularly limited. Any type of semiconducting light emitting nanoparticles, for examples, spherical shaped, elongated shaped, star shaped, polyhedron shaped semiconducting light emitting nanoparticles, can be used.

According to the present invention, said one or more shell layers of the semiconducting light emitting nanoparticle is preferably a single shell layer, a double shell layer, or multishell layers having more than two shell layers, most preferably it is a double shell layer.

As used herein, the term "shell layer" means the structure covering fully or partially said core. Preferably, said one or more shell layers fully covers said core. The terms "core" and "shell" are well known in the art and typically used in the field of quantum materials, such as U.S. Pat. No. 8,221,651 B2. As used herein, the term "nano" means the size in between 0.1 nm and 999 nm, preferably, it is from 0.1 nm to 150 nm.

In a preferred embodiment of the present invention, the semiconducting light emitting nanoparticle of the present invention is a quantum sized material.

As used herein, the term "quantum sized" means the size of the semiconductor material itself without ligands or another surface modification, which can show the quantum confinement effect, like described in, for example, ISBN: 978-3-662-44822-9. Generally, it is said that the quantum sized materials can emit tunable, sharp and vivid colored light due to "quantum confinement" effect.

Preferably, the size of the overall structure of the quantum sized material is from 1 nm to 100 nm, more preferably, it is from 1 nm to 30 nm, even more preferably, it is from 5 nm to 15 nm.

According to the present invention, said core of the semiconducting light emitting nanoparticle can vary. For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPGa, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$, $TiO_2$ alloys and a combination of any of these can be used.

In a preferred embodiment of the present invention, said core of the semiconducting light emitting nanoparticle comprises one or more of group 13 elements of the periodic table and one or more of group 15 elements of the periodic table. For example, GaAs, GaP, GaSb, InAs, InP, InPS, InPZnS, InPZn, InPGa, InSb, AlAs, AlP, AlSb, $CuInS_2$, $CuInSe_2$, $Cu_2(InGa)S_4$, and a combination of any of these.

Even more preferably, the core comprises In and P atoms, for example, InP, InPS, InPZnS, InPZn or InPGa.

According to a further preferred embodiment of the present invention, said at least one of the shell layers comprises a $1^{st}$ element of group 12, 13 or 14 of the periodic table and a $2^{nd}$ element of group 15 or 16 of the periodic table. Preferably, all shall layers comprises a $1^{st}$ element of group 12, 13 or 14 of the periodic table and a $2^{nd}$ element of group 15 or 16 of the periodic table.

More preferably, at least one of the shell layers comprises a $1^{st}$ element of group 12 of the periodic table and a $2^{nd}$ element of group 16 of the periodic table. For example, CdS, CdZnS, ZnS, ZnSe, ZnSSe, ZnSSeTe, CdS/ZnS, ZnSe/ZnS or ZnS/ZnSe shell layers can be used. Even more preferably, all shall layers comprises a 1st element of group 12 of the periodic table and a $2^{nd}$ element of group 16 of the periodic table.

Particularly preferably, at least one shell layer is represented by following formula (II), $$ZnS_xSe_yTe_z, \qquad (II)$$

in which 0≤x≤1, 0≤y≤1, 0≤z≤1, and x+y+z=1, with 0≤x≤1, 0≤y≤1, z=0, and x+y=1 being even more preferred.

ZnS, ZnSe, ZnSeS, ZnSeSTe, CdS/ZnS, ZnSe/ZnS, ZnS/ZnSe shell layers are most preferably used.

It is further preferred that all shell layers are represented by formula (II). For example, as a semiconducting light emitting nanoparticle for green and/or red emission use, CdSe/CdS, CdSeS/CdZnS, CdSeS/CdS/ZnS, ZnSe/CdS, CdSe/ZnS, InP/ZnS, InP/ZnSe, InP/ZnSe/ZnS, InP/ZnS/ZnSe, InPZn/ZnS, InPZn/ZnSe/ZnS, InPZn/ZnS/ZnSe, ZnSe/CdS, ZnSe/ZnS semiconducting light emitting nanoparticle or combination of any of these, can be used.

More preferably, InP/ZnS, InP/ZnSe, InP/ZnSe/ZnS, InP/ZnS/ZnSe, InPZn/ZnS, InPZn/ZnSe/ZnS, InPZn/ZnS/ZnSe can be used.

In a preferred embodiment of the present invention, said shell layers of the semiconducting light emitting nanoparticle are double shell layers. Said semiconducting light emitting nanoparticles are publicly available, for example, from Sigma-Aldrich and/or described in, for example, *ACS Nano,* 2016, 10 (6), pp 5769-5781, Chem. Moter. 2015, 27, 4893-4898, and the international patent application No. WO 2010/095140 A2.

Additional Ligand(s):

The semiconducting light emitting nanoparticle according to the present invention optionally comprises one or more different types of ligands attached to the outermost surface of the shell layers, in addition to organic ligands A, B and C as defined above, which types of ligands to not take part in the crosslinking or polymerization reaction for forming the polymeric outer layer, provided that these ligands do not affect or disturb the crosslinking or polymerization reaction.

Accordingly, the outermost surface of the shell layers of the semiconducting light emitting nanoparticle according to the present invention may be over-coated with different types of surface ligands together with/in addition to organic ligands A, B and C as defined above, if desired.

According to a preferred embodiment of the present invention, the total amount of organic ligands A, B and C attached to the outermost surface of the one or more shell layers as defined above is in the range from 30 wt. % to 99.9 wt. %, preferably in the range from 50 wt. % to 99.9 wt. %, and most preferably in the range from 70 wt. % to 99.9 wt. % of the total ligands attached onto the outermost surface of the shell layer(s).

Without wishing to be bound by theory, it is believed that such surface ligands can affect that the nanosized fluorescent material is dispersed in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), thiols such as hexadecane thiol and hexane thiol; carboxylic acids such as oleic acid, stearic acid, myristic acid; acetic acid and a combination of any of these.

Examples of surface ligands have been described in, for example, the international patent application No. WO 2012/059931A.

Method:

The problem addressed by the present invention is also solved by a method for preparing a semiconducting light emitting nanoparticle having a polymeric outer layer, the method comprising the steps of:
a) Providing a semiconducting light emitting nanoparticle comprising a core, one or more shell layers and at least one organic ligand A, at least one organic ligand B and at least one organic ligand C attached to the outermost surface of the shell layers, wherein the at least one organic ligand A comprises a crosslinkable functional group X, the at least one organic ligand B comprises a crosslinkable functional group Y and the at least one organic ligand C comprises a crosslinkable functional group Z; and
b) crosslinking the at least one organic ligand A, the at least one organic ligand B and the at least one organic ligand C to form a polymeric outer layer by subjecting the nanoparticle of step a) to a condition permitting formation of direct linkages between the at least one organic ligand A, the at least one organic ligand B and the at least one organic ligand C through crosslinkable functional groups X, Y and Z.

For example, according to the present invention, in the step of crosslinking the at least one organic ligand A, the at least one organic ligand B and the at least one organic ligand C to form the polymeric outer layer, direct linkages of the at least one organic ligand A with at least one organic ligand B and one organic ligand C, direct linkages of the at least one organic ligand B with at least one organic ligand A and one organic ligand C, and/or direct linkages of the at least one organic ligand C with at least one organic ligand A and one organic ligand B, through crosslinkable functional groups X, Y and Z, may be formed.

The core and the one or more shell layers of the semiconducting light emitting nanoparticle are as defined above.

The at least one organic ligand A, the at least one organic ligand B and the at least one organic ligand C as well as the respective functional groups X, Y and Z are as defined above.

Accordingly, in a preferred embodiment of the present method, the at least one organic ligand A, the at least one organic ligand B and the at least one organic ligand C are each represented by the general formula (I)

$$U\text{---}V\text{---}W \qquad (I),$$

in which groups U, V and W are as defined above.

According to a further preferred embodiment of the method according to the present invention, group U is identical in each of the at least one organic ligand A, the at least one organic ligand B and the at least one organic ligand C and/or group V is identical in each of the at least one organic ligand A, the at least one organic ligand B and the at least one organic ligand C.

Further preferably, in each of the at least one organic ligand A, the at least one organic ligand B and the at least one organic ligand C group U is a phosphonic acid group and group V is a straight-chain alkylene group having 1 to 20 C atoms, where one or more non-adjacent methylene structural units ($-CH_2-$) in said straight-chain alkylene group may be replaced by a phenylene group, a sulfonyl group, a carbonyl group, an ether group, a sulfide group, a sulfoxide group, an ester group, a phosphoester group, an amide group or an imine group.

According to a further preferred embodiment of the method according to the present invention, crosslinkable functional groups X, Y and Z are identical in each of the at least one organic ligand A, the at least one organic ligand B and the at least one organic ligand C.

Accordingly, it may be preferred according to the present invention that the semiconducting nanoparticle obtained or obtainable by the method of the present invention has a polymeric outer layer which is formed by direct linkages of organic ligands A, B and C through identical crosslinkable functional groups.

According to a still further preferred embodiment of the method according to the present invention, the at least one organic ligand A, the at least one organic ligand B and the at least one organic ligand C are identical.

This means that it may be preferred according to the present invention that the semiconducting nanoparticle obtained or obtainable by the method of the present invention has a polymeric outer layer which is formed by direct linkages of identical organic ligands A, B and C attached to the outermost surface of the nanoparticle.

Further preferably, functional groups X, Y and Z identically selected from a thiol group, an acrylate group, and a styrene group.

In a further preferred embodiment of the method according to the present invention, the at least one organic ligand A, the at least one organic ligand B and the at least one organic ligand C are identically selected from 11-mercaptoundecylphosphonic acid, 11-phosphonoundecyl acrylate and p-[(4-ethenylphenyl)methyl] phosphonic acid.

Within the method of the present invention, the type of the crosslinking or polymerization reaction (i.e., the reaction mechanism) in the step b) of crosslinking the at least one organic ligand A, the at least one organic ligand B and the at least one organic ligand C through crosslinkable functional groups X, Y and Z, thereby forming the polymeric outer layer, is not particularly limited.

Any type of polymerization mechanism known to a person skilled in the art may be applied, such as condensation polymerization (polycondensation) or addition polymerization (polyaddition), in particular anionic polymerization, cationic polymerization, radical polymerization or coordination polymerization.

The type of polymerization mechanism mainly depends on the type of the crosslinkable or polymerizable functional group and/or the way the polymerization reaction is initiated and/or on the reaction conditions, all which factors are known to a person skilled in the art.

The condition permitting to form cross-linkage according to step b) of the method of the present invention is not particularly limited, and any appropriate condition known by a person skilled in the art to initiate and propagate crosslinking and polymerization reaction, respectively, may be applied.

For example, the system including the semiconducting light emitting nanoparticle having the at least one organic ligand A, the at least one organic ligand B and the at least one organic ligand C attached to the outermost surface of the one or more shell layers (each in its non-crosslinked form) may be heated for example to temperatures of about 20° C. to about 200° C., in order to initiate and propagate the crosslinking or polymerization reaction.

Or, the system may be exposed to light of a predetermined wavelength, preferably UV (electromagnetic radiation with a wavelength from about 100 nm to about 400 nm), in order to initiate and propagate the crosslinking or polymerization reaction.

Alternatively, or additionally, to application of heat to the system or light exposure, a polymerization initiator may be added to the system in order to initiate and facilitate the crosslinking or polymerization reaction. This allows for crosslinking or polymerization to be initiated and propagated at lower temperatures or even without applying heat.

As used herein, a polymerization initiator is a molecule or compound that creates reactive species (free radicals, cations or anions) by different pathways including dissociation and electron transfer.

Accordingly, a photo-initiator is a molecule or compound that creates such reactive species when exposed to light (UV or visible light), and a thermo-initiator is a molecule or compound that creates such reactive species when heat is applied.

The polymerization initiator is not particularly limited within the present method and may be, for example, a photo-initiator, a nucleophilic initiator, a radical initiator or a thermo-initiator, suitable examples of which are known to a person skilled in the art. Preferably, a photo-initiator or thermo-initiator is used.

The reaction time for preparing the polymeric outer layer, that is, the duration of the crosslinking or polymerization reaction, is not particularly limited, and may be selected appropriately. For example, the crosslinking may be performed for greater than or equal to about 1 minute, for example, about 10 minutes to about 12 hours, but it is not limited thereto.

The temperature applied and the wavelength and the intensity of the light exposed may be selected based on the types and the amounts of thermo- and photo-initiator, respectively, and the types and the amounts of quantum dot or the like.

Further preferably, when a polymerization initiator is used, it is added in a low amount of not more than 1.0 wt.-% based on the total weight of the nanoparticles (that is, including the surface attached ligands).

As mentioned above, it is preferred according to the present invention that the at least one organic ligand A, the at least one organic ligand B and the at least one organic ligand C are crosslinked with each other as defined above without the addition and/or incorporation of any (bifunctional) cross-linking agents.

Accordingly, in a preferred embodiment of the method of the invention in step b) the crosslinking is performed in the absence of any cross-linking agent.

According to a still further preferred embodiment of the method according to the present invention, the step a) of providing the nanoparticle comprises the steps of a1) preparing a solution containing a nanoparticle precursor species comprising a core and one or more shell layers and, optionally, an initial organic ligand compound attached to the outermost surface of the shell layers, and a2) adding to the solution the at least one organic ligand A, the at least one organic ligand B and the at least one organic ligand C comprising crosslinkable functional groups X, Y and Z, respectively.

As the solvent for step a1), for example, toluene, hexane, chloroform, ethyl acetate, benzene, xylene, ethers, tetrahydrofuran, dichloromethane and heptane and a mixture of thereof, can be used, without being limited thereto.

Upon addition of the at least one organic ligand A, the at least one organic ligand B and the at least one organic ligand C to the solution containing the nanoparticle precursor species, the initial organic ligand compound, if present, is replaced through ligand exchange and binding of the respective organic ligands A, B and C via a nanoparticle surface attaching functional group is affected.

The initial organic ligand compound is not particularly limited and may be any compound known to a person skilled in the art and commonly used in the art, for example, to improve storage behavior of a nanoparticle precursor species, etc., or which remained from the process of preparing the nanoparticle precursor.

By following method step a), in particular method steps a1) and a2), of the method of the present invention as described above, a semiconducting light emitting nanoparticle comprising a core, one or more shell layers, and at least one organic ligand A, at least one organic ligand B and at least one organic ligand C, each attached in its non-crosslinked form to the outermost surface of the shell layers, wherein, the at least one organic ligand A comprises a crosslinkable functional group X, the at least one organic ligand B comprises a crosslinkable functional group Y and the at least one organic ligand C comprises a crosslinkable functional group Z, characterized in that groups X, Y and Z are each capable of acting as a crosslinking acceptor and as a crosslinking donator, can be prepared, or is obtainable from this reaction step or can be obtained or isolated therefrom.

Therefore, the present invention also relates to a semiconducting light emitting nanoparticle obtained or obtainable from reaction step a) of the method described herein.

The semiconducting light emitting nanoparticle obtained or obtainable by the method described herein comprises a core, one or more shell layers, at least one organic ligand A, at least one organic ligand B and at least one organic ligand C attached to the outermost surface of the shell layers, and a polymeric outer layer, characterized in that the polymeric outer layer is formed by direct linkages between the at least one organic ligand A, the at least one organic ligand B and the at least one organic ligand C through crosslinkable functional groups X, Y and Z.

Therefore, the present invention further relates to a semiconducting light emitting nanoparticle having a polymeric outer layer obtained or obtainable by the method described herein.

The method as described herein allows preparation of a semiconducting light emitting nanoparticle being surrounded by a protective polymeric outer layer which is formed by intramolecular self-crosslinking of the ligands attached to the surface of the nanoparticles and does not require the presence of any additional crosslinking agents or (co)polymers, or other protective elements.

Using only the surface-attached ligands to form the protective layer, i.e., without the addition of any additional crosslinking agents and the like, allows for maintaining high concentration of the semiconducting light emitting nanoparticles in a layer of an organic device, thereby improving light emission output from an opto-electric device, based on a quantum material layer as the emissive element.

Furthermore, by using functionalized ligands as defined herein, which comprise a nanoparticle surface attaching functional group and a crosslinkable functional group, ligand exchange of the initial organic ligand compound and formation of the polymeric outer layer in one step is possible. That is, the polymeric outer layer can be formed around the quantum dots while ligand exchange takes place.

The said polymeric outer layer of the semiconducting light emitting nanoparticle obtained by the method described herein prevents penetration of oxidative elements from, for example, the atmosphere or the surrounding matrix, which elements react with the ligands and cause detachment of the ligands from the nanoparticle surface. Also, the said polymeric outer layer prevents ligands that are detached from the surface to diffuse away, but instead allows the detached ligands to re-attach to the surface with high probability.

By this, a drop of quantum yield of the quantum dots as a result of ligand detachment under heat and light conditions and in radical rich environments can be prevented. Instead, a better performance of the semiconducting nanoparticles and a higher stability in solution and against radical rich environments is achieved using the method described herein for preparing a semiconducting light emitting nanoparticle.

Composition:

In another aspect, the present invention further relates to a composition comprising the semiconducting light emitting nanoparticle having a polymeric outer layer as defined herein or obtained according to the method described herein, and at least one additional material, preferably an organic functional material, more preferably the additional material is selected from the group consisting of fluorescent emitters, phosphorescent emitters, host materials, matrix materials, electron transporting materials, electron injecting materials, hole transporting materials, hole injecting materials, electron blocking materials, hole blocking materials, wide band gap materials, delayed fluorescent emitters and delayed fluorescent hosts. In a preferred embodiment of the present invention, the additional material is a matrix material.

According to the present invention, a wide variety of publicly known transparent matrix materials suitable for optical devices can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

In some embodiments of the present invention, the transparent matrix material can be a transparent polymer.

According to the present invention the term "polymer" means a material having a repeating unit and having the weight average molecular weight (Mw) 1000 or more.

In some embodiments of the present invention, the glass transition temperature (Tg) of the transparent polymer is 70° C. or more and 250° C. or less.

Tg is measured based on changes in the heat capacity observed in Differential scanning colorimetry like described in Rickey J Seyler, Assignment of the Glass Transition, ASTM publication code number (PCN) 04-012490-50.

For examples, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000.

More preferably it is from 10,000 to 250,000.

Formulation:

The present invention furthermore relates to a formulation comprising the semiconducting light emitting nanoparticle having a polymeric outer layer as defined herein or the composition as defined herein, and at least one solvent.

Preferably the said solvent is selected from one or more members of the group consisting of aromatic, halogenated and aliphatic hydrocarbon solvents, more preferably selected from one or more members of the group consisting of toluene, xylene, chloroform, dichloromethane and heptane.

The amount of the solvent in the formulation can be freely controlled according to the method of coating the formulation. For example, if the formulation is to be spray-coated, it can contain the solvent in an amount of 90 wt. % or more. Further, if a slit-coating method is to be carried out, which is often adopted in coating a large substrate, the content of the solvent is normally 60 wt. % or more, preferably 70 wt. % or more.

Use:

The present invention furthermore relates to the use of the semiconducting light emitting nanoparticle having a polymeric outer layer as defined herein, or the composition, or the formulation according to the present invention in an electronic device, optical device or in a biomedical device.

Optical Medium:

The present invention in addition relates to an optical medium comprising the semiconducting light emitting nanoparticle having a polymeric outer layer as defined herein or the composition according to the present invention.

In some embodiments of the present invention, the optical medium can be an optical film, for example, a color filter, color conversion film, remote phosphor tape, or another film or filter.

Optical Device:

The invention further relates to an optical device comprising the optical medium according to the invention.

The optical device is preferably a liquid crystal display, Organic Light Emitting Diode (OLED), backlight unit for display, Light Emitting Diode (LED), Micro Electro Mechanical Systems (here in after "MEMS"), electro wetting display, or an electrophoretic display, a lighting device, and/or a solar cell.

The present invention provides a new concept of using as the surface attached ligands such functionalized ligands, which comprise a nanoparticle surface attaching functional group as well as a crosslinkable or polymerizable functional group, and crosslinking the surface attached ligands themselves (i.e., intramolecularly), so that a polymeric network is formed that creates, or corresponds to a polymeric outer layer surrounding the nanoparticle surface. The polymeric outer layer advantageously provides steric protection against any kind of outside elements and also prevents ligands that are detached from the surface to diffuse away, but instead allows the detached ligands to re-attach to the surface with high probability.

Further, this protection concept advantageously does not require any additional materials, compounds or linking agents to be added to the semiconducting nanoparticles, and therefore allows application of highly concentrated semiconducting light emitting nanoparticle layers, thereby improving light emission output from an optoelectric device, based on a quantum material layer as the emissive element.

PREFERABLE EMBODIMENTS

Embodiment 1

A semiconducting light emitting nanoparticle comprising a core,
one or more shell layers, and
at least one organic ligand A, at least one organic ligand B and at least one organic ligand C attached to the outermost surface of the shell layers,
wherein
the at least one organic ligand A comprises a crosslinkable functional group X,
the at least one organic ligand B comprises a crosslinkable functional group Y, and
the at least one organic ligand C comprises a crosslinkable functional group Z,
characterized in that
groups X, Y and Z are each capable of acting as a crosslinking acceptor and as a crosslinking donator.

Embodiment 2

The nanoparticle according to embodiment 1, characterized in that
group X is capable of acting as a crosslinking acceptor with respect to group Y and as a crosslinking donator with respect to group Z, or as a crosslinking acceptor with respect to group Z and as a crosslinking donator with respect to group Y;
group Y is capable of acting as a crosslinking acceptor with respect to group Z and as a crosslinking donator with respect to group X, or as a crosslinking acceptor with respect to group X and as a crosslinking donator with respect to group Z; and
group Z is capable of acting as a crosslinking acceptor with respect to group X and as a crosslinking donator with respect to group Y, or as a crosslinking acceptor with respect to group Y and as a crosslinking donator with respect to group X.

Embodiment 3

The nanoparticle according to embodiment 1 or 2, characterized in that the at least one organic ligand A, the at least one organic ligand B and the at least one organic ligand C are each represented by the general formula (I)

$$U-V-W \quad (I)$$

where U is at each occurrence in ligands A, B and C, identically or differently, a nanoparticle surface attaching group, V is at each occurrence in ligands A, B and C, identically or differently, a linker group, and W corresponds to crosslinkable functional groups X, Y and Z, respectively.

Embodiment 4

The nanoparticle according to claim 3, characterized in that in formula (I),

U is at each occurrence in ligands A, B and C, identically or differently, selected from the group consisting of a phosphonic acid group, a thiol group, a thiolate group, a thioic acid group, a dithioic acid group, a mercaptoester group, a carboxylic acid group, a carboxylate group, in particular Zn-carboxylate, a phosphonate group, in particular Zn-phosphonate, a thiocarbamate group, in particular Zn-thiocarbamate, a phosphine group, a phosphinoxide group, an amine group, an amide group, and a selenol group;
V is at each occurrence in ligands A, B and C, identically or differently, selected from the group consisting of a straight-chain alkylene group having 1 to 20 C atoms, or branched alkylene group having 3 to 20 C atoms, where one or more non-adjacent methylene structural units (—CH2—) in said straight-chain and branched alkylene groups may in each case be replaced by a phenylene group, a sulfonyl group, a carbonyl group, an ether group, a sulfide group, a sulfoxide group, an ester group, a phosphoester group, an amide group or an imine group, or a straight-chain alkenylene group or alkynylene group having 2 to 20 C atoms or a branched alkenylene group or alkynylene group having 3 to 20 C atoms, where one or more methylene structural units (—CH2—) in said straight-chain and branched alkenylene or alkynylene groups may in each case be replaced by a phenylene group, a sulfonyl group, a carbonyl group, an ether group, a sulfide group, a sulfoxide group, an ester group, a phosphoester group, an amide group or an imine group; and
X, Y and Z are independently of each other selected from the group consisting of a thiol group, an acrylate group, a styrene group, a carbonate group, and a carbamate (urethane) group.

Embodiment 5

The nanoparticle according to embodiment 3 or 4, characterized in that group U is identical in each of the at least one organic ligand A, the at least one organic ligand B and the at least one organic ligand C and/or V is identical in each of the at least one organic ligand A, the at least one organic ligand B and the at least one organic ligand C.

Embodiment 6

The nanoparticle according to any one of embodiments 3 to 5, characterized in that U is a phosphonic acid group and group V is a straight-chain alkylene group having 1 to 20 C atoms, where one or more non-adjacent methylene structural units (—CH2—) in said straight-chain alkylene group may be replaced by a phenylene group, a sulfonyl group, a carbonyl group, an ether group, a sulfide group, a sulfoxide group, an ester group, a phosphoester group, an amide group or an imine group.

Embodiment 7

The nanoparticle according to any one of embodiments 1 to 6, characterized in that groups X, Y and Z are identical.

Embodiment 8

The nanoparticle according to any one of embodiments 1 to 7, characterized in that the at least one organic ligand A, the at least one organic ligand B and the at least one organic ligand C are identical.

Embodiment 9

The nanoparticle according to any one embodiments 1 to 8, characterized in that groups X, Y and Z are identically selected from a thiol group, an acrylate group, and a styrene group.

Embodiment 10

The nanoparticle according to any one of embodiments 1 to 9, characterized in that the at least one organic ligand A, the at least one organic ligand B and the at least one organic ligand C are identically selected from 11-mercaptoundecylphosphonic acid, 11-phosphonoundecyl acylate and p-[(4-ethenylphenyl)methyl] phosphonic acid.

Embodiment 11

The semiconducting light emitting nanoparticle according to any one of embodiments 1 to 10, comprising
a core,
one or more shell layers,
at least one organic ligand A, at least one organic ligand B and at least one organic ligand C attached to the outermost surface of the shell layers, and
a polymeric outer layer,
characterized in that
the polymeric outer layer is formed by direct linkages between the at least one organic ligand A, the at least one organic ligand B and the at least one organic ligand C through crosslinkable functional groups X, Y and Z.

Embodiment 12

The semiconducting light emitting nanoparticle according to embodiment 11, characterized in that the polymeric outer layer is formed by direct linkages of the at least one organic ligand A with at least one organic ligand B and one organic ligand C, direct linkages of the at least one organic ligand B with at least one organic ligand A and one organic ligand C, and/or direct linkages of the at least one organic ligand C with at least one organic ligand A and one organic ligand B, through crosslinkable functional groups X, Y and Z.

Embodiment 13

A method for preparing a semiconducting light emitting nanoparticle having a polymeric outer layer, the method comprising the steps of:
a) providing a semiconducting light emitting nanoparticle comprising a core, one or more shell layers and at least one organic ligand A, at least one organic ligand B and at least one organic ligand C attached to the outermost surface of the shell layers, wherein the at least one organic ligand A comprises a crosslinkable functional group X, the at least one organic ligand B comprises a crosslinkable functional group Y and the at least one organic ligand C comprises a crosslinkable functional group Z; and
b) crosslinking the at least one organic ligand A, the at least one organic ligand B and the at least one organic ligand C to form a polymeric outer layer by subjecting the nanoparticle of step a) to a condition permitting formation of direct linkages between the at least one organic ligand A, the at least one organic ligand B and the at least one organic ligand C through crosslinkable functional groups X, Y and Z.

Embodiment 14

The method according to embodiment 13, characterized in that the at least one organic ligand A, the at least one organic ligand B and the at least one organic ligand C are each represented by the general formula (I)

$$U-V-W \qquad (I)$$

where U is at each occurrence in ligands A, B and C, identically or differently, a nanoparticle surface attaching group, V is at each occurrence, identically or differently, a linker group, and W corresponds to crosslinkable functional groups X, Y and Z, respectively.

Embodiment 15

The method according to embodiment 14, characterized in that in formula (I)
U is at each occurrence in ligands A, B and C, identically or differently, selected from the group consisting of a phosphonic acid group, a thiol group, a thiolate group, a thioic acid group, a dithioic acid group, a mercaptoester group, a carboxylic acid group, a carboxylate group, in particular Zn-carboxylate, a phosphonate group, in particular Zn-phosphonate, a thiocarbamate group, in particular Zn-thiocarbamate, a phosphine group, a phosphinoxide group, an amine group, an amide group, and a selenol group;
V is at each occurrence in ligands A, B and C, identically or differently, selected from the group consisting of a straight-chain alkylene group having 1 to 20 C atoms, or branched alkylene group having 3 to 20 C atoms, where one or more non-adjacent methylene structural units (—CH2—) in said straight-chain and branched alkylene groups may in each case be replaced by a phenylene group, a sulfonyl group, a carbonyl group, an ether group, a sulfide group, a sulfoxide group, an ester group, a phospocster phosphoester group, an amide group or an imine group, or a straight-chain alkenylene group or alkynylene group having 2 to 20 C atoms or a branched alkenylene group or alkynylene group having 3 to 20 C atoms, where one or more methylene structural units (—CH2—) in said straight-chain and branched alkenylene or alkynylene groups may in each case be replaced by a phenylene group, a sulfonyl group, a carbonyl group, an ether group, a sulfide group, a sulfoxide group, an ester group, a phosphoester group, an amide group or an imine group;
X, Y and Z are independently of each other selected from the group consisting of a thiol group, an acrylate group, a styrene group, a carbonate group, and a carbamate (urethane) group.

Embodiment 16

The method according to embodiment 14 or 15, characterized in that group U is identical in each of the at least one organic ligand A, the at least one organic ligand B and the at least one organic ligand C and/or group V is identical in each of the at least one organic ligand A, the at least one organic ligand B and the at least one organic ligand C.

Embodiment 17

The method according to any one of embodiments 14 to 16, characterized in that U is a phosphonic acid group and V is a straight-chain alkylene group having 1 to 20 C atoms, where one or more non-adjacent methylene structural units (—CH2—) in said straight-chain alkylene group may be replaced by a phenylene group, a sulfonyl group, a carbonyl group, an ether group, a sulfide group, a sulfoxide group, an ester group, a phosphoester group, an amide group or an imine group.

Embodiment 18

The method according to any one of embodiments 13 to 17, characterized in that groups X, Y and Z are identical.

Embodiment 19

The method according to any one of embodiments 13 to 18, characterized in that the at least one organic ligand A, the at least one organic ligand B and the at least one organic ligand C are identical.

Embodiment 20

The method according to any one of embodiments 13 to 19, characterized in that groups X, Y and Z are identically selected from a thiol group, an acrylate group, and a styrene group.

Embodiment 21

The method according to any one of embodiments 13 to 20, characterized in that the at least one organic ligand A, the at least one organic ligand B and the at least one organic ligand C are identically selected from 11-mercaptoundecylphosphonic acid, 11-phosphonoundecyl acrylate and p-[(4-ethenylphenyl)methyl] phosphonic acid.

Embodiment 22

The method according to any one of embodiments 13 to 21, characterized in that in step b) the condition permitting to form direct linkages between the at least one organic ligand A, the at least one organic ligand B and the at least one organic ligand C is application of heat, optionally in the presence of a polymerization initiator, in particular a thermo initiator.

Embodiment 23

The method according to any one of embodiments 13 to 21, characterized in that in step b) the condition permitting to form direct linkages between the at least one organic ligand A, the at least one organic ligand B and the at least one organic ligand C is light exposure, optionally in the presence of a polymerization initiator, in particular a photo initiator.

Embodiment 24

The method according to embodiment 22 or 23, characterized in that the polymerization initiator is present in an amount of not more than 1.0 wt.-% based on the total weight of the nanoparticles.

Embodiment 25

The method according to any one of embodiments 13 to 24, characterized in that the crosslinking in step b) is performed in the absence of any cross-linking agent.

Embodiment 26

The method according to any one of embodiments 13 to 25, wherein the step a) of providing the nanoparticle comprises a1) preparing a solution containing a nanoparticle precursor species comprising a core and one or more shell layers and, optionally, an initial organic ligand compound attached to the outermost surface of the shell layers, and a2) adding to the solution the at least one organic ligand A, the at least one organic ligand B and the at least one organic ligand C comprising crosslinkable functional groups X, Y and Z, respectively.

Embodiment 27

A semiconducting light emitting nanoparticle, obtained or obtainable from reaction step a) of embodiment 13.

Embodiment 28

A semiconducting light emitting nanoparticle having a polymeric outer layer, obtained or obtainable by the method of any one of embodiments 13 to 26.

Embodiment 29

Composition comprising at least one semiconducting light emitting nanoparticle according to embodiment 11 or 28, and at least one additional material, preferably an organic functional material, more preferably the additional material is selected from the group consisting of fluorescent emitters, phosphorescent emitters, host materials, matrix materials, electron transporting materials, electron injecting materials, hole transporting materials, hole injecting materials, electron blocking materials, hole blocking materials, wide band gap materials, delayed fluorescent emitters and delayed fluorescent hosts.

Embodiment 30

Formulation comprising at least one semiconducting light emitting nanoparticle according to embodiment 11 or 28, or at least one composition according to embodiment 29, and at least one solvent, preferably the solvent is selected from one or more members of the group consisting of aromatic, halogenated and aliphatic hydrocarbons solvents, more preferably selected from one or more members of the group consisting of toluene, xylene, chloroform, dichloromethane and heptane.

Embodiment 31

Use of a semiconducting light emitting nanoparticle according to embodiment 11 or 28, or a composition according to embodiment 29, or a formulation according to embodiment 30, in an electronic device, optical device or biomedical device.

Embodiment 32

Optical medium comprising at least one semiconducting light emitting nanoparticle according to embodiment 11 or 28, or at least one composition according to embodiment 29, or a formulation according to embodiment 30.

Embodiment 33

Optical device comprising an optical medium according to embodiment 32.

The invention is described in more detail below with the help of examples which are not to be considered as limiting the scope of the invention.

WORKING EXAMPLES

Working Example 1—Quantum Dots (QD) with 11-Mercaptoundecylphosphonic Acid (11-MPA) as Ligand Ligand Exchange:

5 mL of a quantum dots precursor containing solution (50 mg/mL QDs in toluene) are mixed with 0.06 g 11-MPA (purchased from Sigma-Aldrich-754269) and stirred, first for 1 h at 50° C. under argon to dissolve the 11-MPA, then additionally at 20° C. overnight to effect ligand exchange. The mixture is transferred into a centrifuge vial and 5 mL dried methanol is added. Then, the mixture is centrifuged at 4000 rpm for 5 min under argon. Afterwards, the colorless supernatant is removed and the red precipitation is suspended in 5 mL dried toluene.

To confirm ligand exchange, the thus obtained quantum dots and the precursor quantum dots (i.e., QDs before ligand exchange) are analyzed by Fourier-transform infrared spectroscopy (FT-IR). All FT-IR measurements shown herein are measured using a Bruker's Vertex 70 (ATR diamond A225/QHP).

Figure 1:
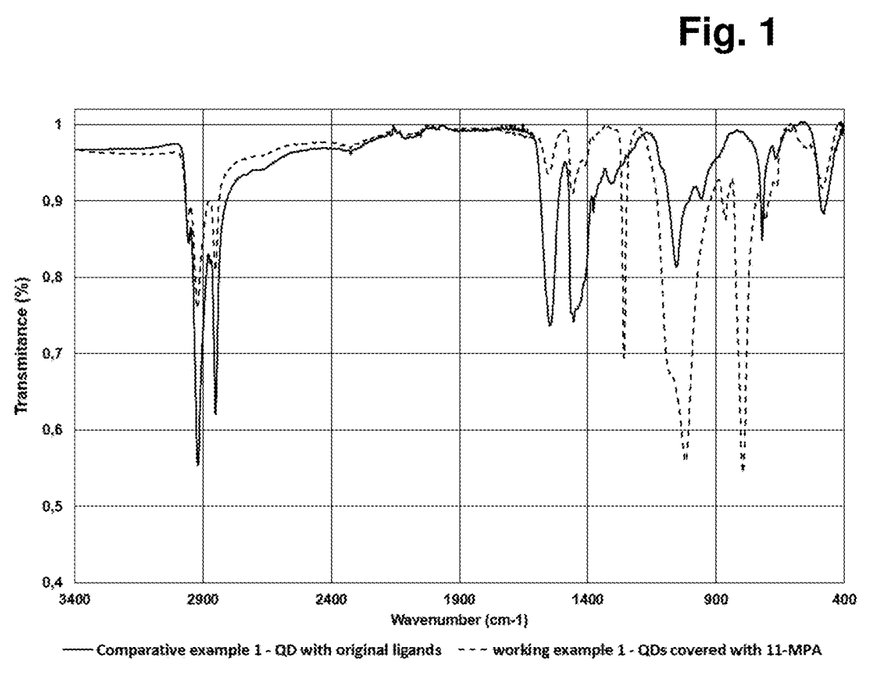
FIG. 1 shows the FT-IR spectra of quantum dots before ligand exchange and after ligand exchange with 11-MPA.

FIG. 1 shows the FT-IR spectra of quantum dots samples before ligand exchange and after ligand exchange with 11-MPA. The disappearance of the peaks at 1450 cm$^{-1}$ and at 1550 cm$^{-1}$ indicates effective ligand exchange. For this, 50 uL of 11-MPA covered quantum dots, dissolved in Toluene, is deposited in room temperature on an ATR diamond A225/QHP surface. The solvent is let to evaporate for 1 minute, before measurement is taken.

Crosslinking:

100 mg of thus obtained quantum dots are dissolved in 2 mL of dried toluene and mixed with 3 mg of photo-initiator Irgacure TPO (diphenyl(2,4,6-trimethylbenzoyl) phosphine oxide, purchased from Sigma Aldrich-415952). The mixture is stirred at 20° C. under argon for 1 hour while being exposed to light with a wavelength of 365 nm at an intensity of 2 mW/cm$^2$.

Figure 2A:
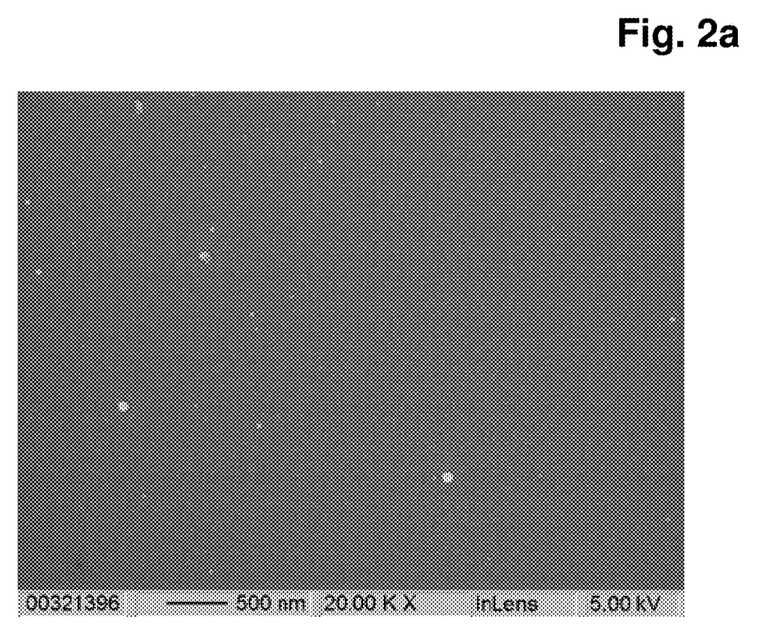
FIG. 2a is a SEM image of a 11-MPA sample obtained in working example 1 after exposure to light (365 nm, 1 hour)
Figure 2B:
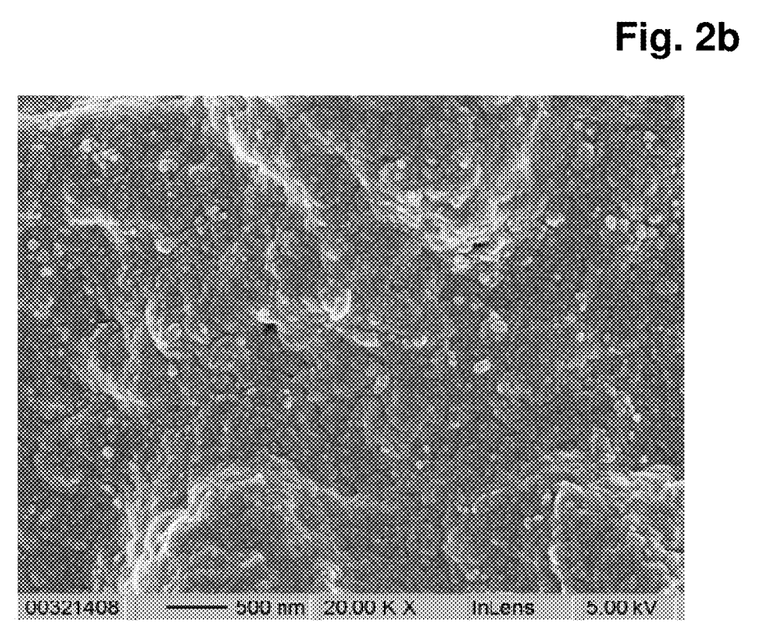
FIG. 2b is a SEM image of a sample of original quantum dots.

FIG. 2a is an image of an 11-MPA sample after crosslinking (i.e., after exposure to light), and FIG. 2b is an image of a sample of the precursor quantum dots (i.e., before ligand exchange, corresponding to comparative example 1 below), each taken on a scanning electron microscope (SEM). The SEM image of the 11-MPA sample of working example 1 (FIG. 2a) shows large structures, indicating polymerization of the 11-MPA, while the SEM image of the sample of the precursor quantum dots (FIG. 2b) shows no such structures.

Working Example 2—Quantum Dots with p-[(4-Ethenylphenyl)Methyl] Phosphonic Acid as Ligand Ligand Exchange:

5 mL of a quantum dots precursor containing solution (50 mg/mL QDs in tetrahydrofuran (THF)) are mixed with 0.16 g p-[(4-ethenylphenyl)methyl] phosphonic acid (specific polymers; SP-51-003) and stirred overnight at 50° C. under argon to effect ligand exchange. Then, the THF is evaporated and the quantum dots obtained therefrom are re-dissolved in toluene at a concentration of 50 mg/mL. The mixture is transferred into a centrifuge vial and dried methanol is added. The final ratio toluene:methanol in the mixture is 2:1. The mixture is then centrifuged at 4000 rpm for 5 min under argon. Afterwards, the colorless supernatant is removed and the red precipitation is suspended in dried toluene at a concentration of 50 mg/mL.

Crosslinking:

In order to initiate and propagate the crosslinking reaction, the thus obtained suspension is heated to a temperature of 200° C. while maintaining the concentration of the quantum dots at 15 mg/mL.

Working Example 3—Quantum Dots with p-[(4-Ethenylphenyl)Methyl] Phosphonic Acid as Ligand Ligand Exchange:

Ligand exchange is performed as described with respect to working example 2.

Crosslinking:

Thermo-initiator 2,2'-Azobis(2-methylpropionitrile), 0.2 M solution in toluene (purchased from Sigma Aldrich-714887), is added to the thus obtained suspension in an amount of about 1 wt.-% compared to the mass of the quantum dots, and the suspension is heated to 80° C. in order to initiate and propagate the crosslinking reaction, while maintaining the concentration of the quantum dots at 15 mg/mL.

Working Example 4—Quantum Dots with 11-Phosphonoundecyl Acrylate as Ligand

Ligand Exchange:

15 mL of a quantum dots precursor containing solution (25 mg/mL in toluene) are mixed with 0.124 g 11-phosphonoundecyl acrylate (purchased from Sigma Aldrich-795739) and stirred overnight at 50° C. under argon to effect ligand exchange. 4 mL of the mixture is transferred into a centrifuge vial and 4 mL dried methanol are added. The mixture is then centrifuged at 4000 rpm for 10 min under argon. Afterwards, the red supernatant is evaporated, and the red precipitation is re-dissolved in 1 mL hexane. The solution is transferred into a centrifuge vial and 2 mL dried methanol are added. The mixture is then centrifuged at 4000 rpm for 10 min under argon. Afterwards, the nearly colorless supernatant is removed, and the red precipitation is re-dissolved in dried toluene at a concentration of 50 mg/mL.

Crosslinking:

In order to initiate and propagate the crosslinking reaction, the thus obtained solution is heated to a temperature of 100° C. while maintaining the concentration of the quantum dots at 15 mg/mL.

Figure 3A:
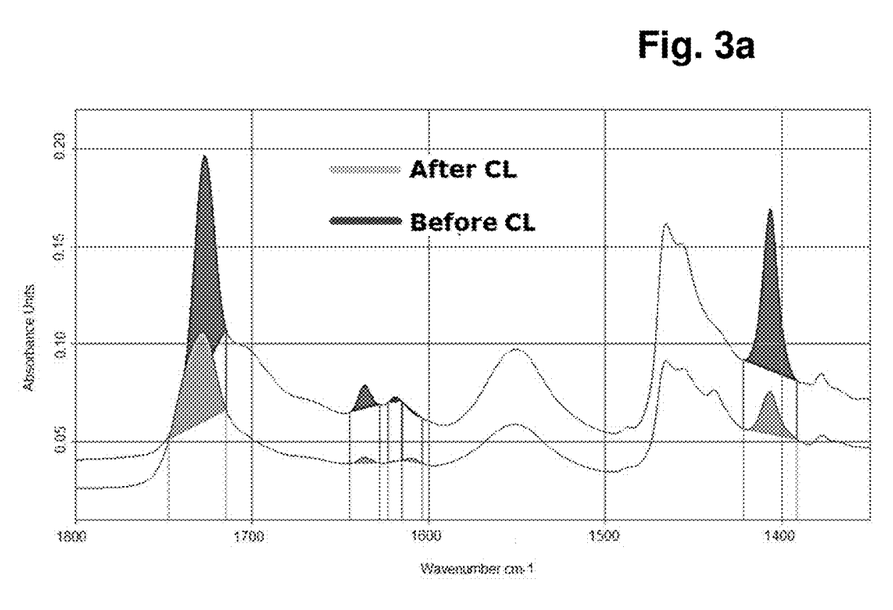
FIG. 3a and FIG. 3b show the FT-IR spectra of quantum dots before crosslinking (CL) (but after ligand exchange with 11-phosphonoundecyl acrylate) and after crosslinking (CL) the ligands.
Figure 3B:
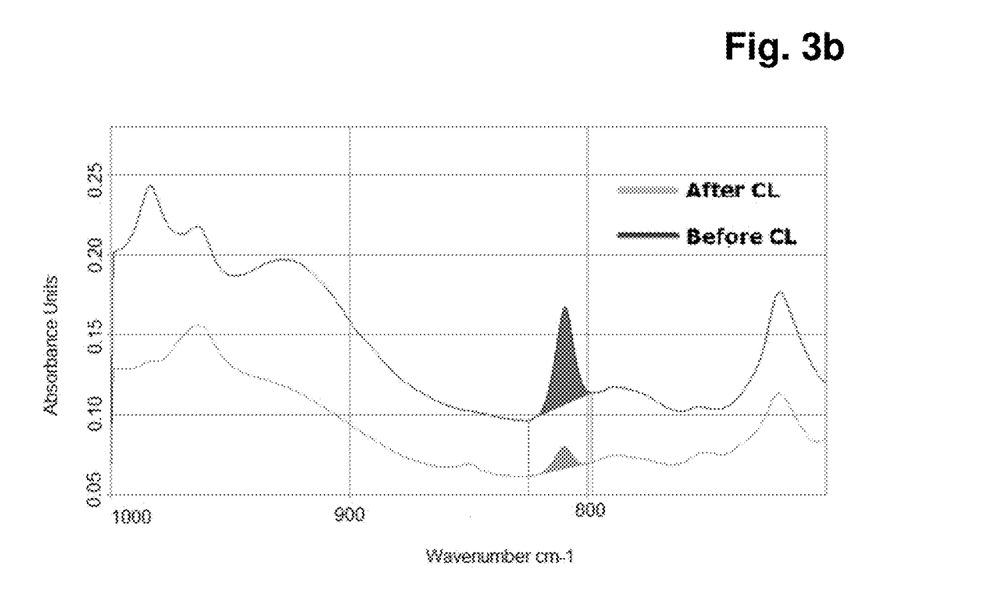

FIG. 3a and FIG. 3b show the FT-IR spectrum (that is, the same spectrum, but different wavenumber ranges are depicted) of quantum dots samples of working example 4 before crosslinking (but after ligand exchange with 11-phosphonoundecyl acrylate) and after crosslinking, and the intensity of peaks relevant to carbon-carbon double bonds are compared. For this, 50 uL of 11-phosphonoundecyl acrylate covered quantum dots, dissolved in Toluene, is deposited in room temperature on an ATR diamond A225/QHP surface.

The solvent is let to evaporate for 1 minute, before measurement is taken. A decrease in intensity of peaks relevant to carbon-carbon double bonds (i.e. at 809 cm$^{-1}$, 1407 cm$^{-1}$, and 1636 cm$^{-1}$, see Table 1 in combination with FIGS. 3a and 3b) during the crosslinking indicates opening of these bonds in the crosslinking reaction. Further, the new peak at 1610 cm$^{-1}$ in the sample after crosslinking indicates polymerization of the ligands.
Determination of Peak Intensity:

$$ratio_{nonCL} = \frac{\int Band @ x}{\int Band @ 1735 \text{ cm}^{-1}}$$

$$ratio_{CL} = \frac{\int Band @ x}{\int Band @ 1735 \text{ cm}^{-1}}$$

"Band@X" means the C=C vibrations.
"Band@1735 cm$^{-1}$" stans for the integral of the C=O vibration.
"ratio non CL" means the ratio of the integral of the C=C vibrations (Band@X) to the integral of the C=O vibration (Band@1735 cm$^{-1}$), before crosslinking.
"ratio CL" stands for the ratio of the integral of the C=C vibrations (Band@X) to the integral of the C=O vibration (Band@1735 cm$^{-1}$), after crosslinking.

In other words, a "band" refers to an FT-IR signal at a wavenumber, matching a known vibration wavenumber of one of the bonds in the examined molecule. This would appear as a gaussian in the FTIR spectrum.

When an acrylic monomer is being polymerized, a C=C bond opens, however the C=O bond stays intact. C=O bonds vibrates at 1735 cm$^{-1}$ wavenumber, so we use the 1735 cm$^{-1}$ as a reference and compare intensities of other vibrations to it.

We then compare the integral of the C=C vibrations (Band@X) to the integral of the C=O vibration (Band@1735 cm$^{-1}$), before crosslinking (aka ratio non CL) and after (ratio CL). When ratio CL is smaller the ratio non CL, this means we have less C=C bonds compared to C=O bonds, indicating a true cross linking.

TABLE 1

| Wavenumber [cm$^{-1}$] | ratio$_{nonCL}$/ratio$_{CL}$ |
|---|---|
| 1735 | 1 |
| 1636 | 2.3 |
| 1610 | 0.5 |
| 1407 | 2.1 |
| 809 | 2.8 |

Working Example 5—Quantum Dots with 11-Phosphonoundecyl Acrylate as Ligand

Ligand Exchange:
Ligand exchange is performed as described with respect to working example 4.
Crosslinking:
Photo-initiator Irgacure TPO is added to the above obtained solution in an amount of about 1 wt.-% compared to the mass of the quantum dots. The mixture is stirred at 20° C. under argon for 1 hour while being exposed with light with a wavelength of 365 nm at an intensity of 2 mW/cm$^2$ in order to initiate and propagate the crosslinking reaction.

Working Example 6—Measurement of Quantum Yield (QY)

All measurements on quantum yield are conducted using a Hamamatsu Quantaurus absolute PL quantum yield spectrometer model c11347-11. One sample of the mixture of working example 1 before exposure to light (i.e. after ligand exchange, but before crosslinking) and one sample of the mixture of working example 1 after exposure to light (365 nm, 1 hour) are taken, and each sample is diluted with dried toluene to a concentration of 0.08 mg/mL. Initial quantum yield of the quantum dots (i.e., after ligand exchange but before exposure to light) and quantum yield after exposure to light (365 nm, 1 hour) are then measured (see FIG. 3).

Comparative Example 1—Precursor Quantum Dots and Measurement of Quantum Yield (QY)

The precursor quantum dots as initially used in working examples 1 to 5 (i.e. QDs still having their initial ligands attached to the surface which is not the ligand of the invention, and without performing ligand exchange with the ligands according to the invention) are dissolved in dry toluene at a concentration of 0.08 mg/mL and initial quantum yield is measured.

Afterwards, 100 mg of precursor quantum dots are dissolved in 2 mL of toluene and mixed with 3 mg photo-initiator Irgacure TPO. The mixture is then stirred at 20° C. for 1 hour while being exposed to light having a wavelength of 365 nm at an intensity of 2 mW/cm$^2$. Then, a sample is taken, diluted with dried toluene to a concentration of 0.08 mg/mL and again quantum yield is measured.

Figure 4:
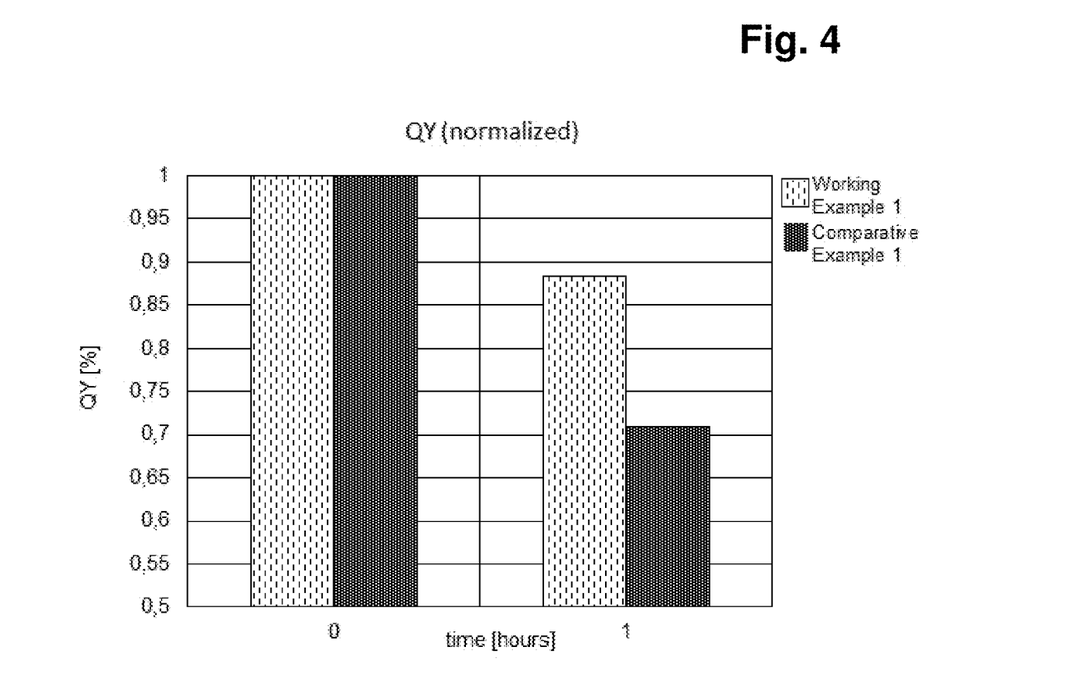
FIG. 4 illustrates the initial quantum yield (t=0 hours) and the quantum yield after exposure to 365 nm light (t=1 hour) of the quantum dots obtained from working example 1 and comparative example 1.

In FIG. 4, the normalized quantum yields measured in working example 6 and comparative example 1 are illustrated. FIG. 4 shows the initial quantum yield (t=0 hours) and the quantum yield after exposure to 365 nm light (t=1 hour) of the quantum dots obtained from working example 6 and comparative example 1 (precursor quantum dots). It can be seen that as a result of ligand exchange and crosslinking with 11-MPA as the ligand the QDs survive the stability test better that the precursor QDs. The ligand exchanged QDs having crosslinked ligands (working ex. 6) show a drop of 11% in QY after 1 hour, while precursor QDs with the initial, non-crosslinked ligands (comp. ex. 1) show a drop of 30%, under the same conditions.

The invention claimed is:
1. An optical medium comprising a semiconducting light emitting nanoparticle comprising
   a core,
   one or more shell layers, and
   a polymeric outer layer,
   at least one organic ligand A, at least one organic ligand B and at least one organic ligand C attached to the outermost surface of the shell layers,
   wherein
   the polymeric outer layer is formed by direct linkages between the at least one organic ligand A, the at least one organic ligand B and the at least one organic ligand C through crosslinking functional group X on the at least one organic ligand A,
   crosslinking functional group Y on the at least one organic ligand B, and crosslinking functional group Z on the at least one organic ligand C,
   groups X, Y and Z each being capable of acting as a crosslinking acceptor and as a crosslinking donator,
   and optionally at least one solvent, selected from one or more members of the group consisting of aromatic, halogenated and aliphatic hydrocarbons solvents.
2. The optical medium according to claim 1, wherein in the nanoparticle group X is capable of acting as a crosslinking acceptor with respect to group Y and as a crosslinking donator with respect to group Z, or as a crosslinking acceptor with respect to group Z and as a crosslinking donator with respect to group Y;
group Y is capable of acting as a crosslinking acceptor with respect to group Z and as a crosslinking donator with respect to group X, or as a crosslinking acceptor with respect to group X and as a crosslinking donator with respect to group Z; and
group Z is capable of acting as a crosslinking acceptor with respect to group X and as a crosslinking donator with respect to group Y, or as a crosslinking acceptor with respect to group Y and as a crosslinking donator with respect to group X.

3. The optical medium according to claim 1, wherein the nanoparticle is produced by crosslinking the at least one organic ligand A, the at least one organic ligand B and the at least one organic ligand C each represented by the general formula (I)

$$U\text{—}V\text{—}W \qquad (I)$$

where U is at each occurrence in ligands A, B and C, identically or differently, a nanoparticle surface attaching group, V is at each occurrence in ligands A, B and C, identically or differently, a linker group, and W corresponds to crosslinkable functional groups X, Y and Z, respectively.

4. The optical medium according to claim 3, wherein in the ligand in formula (I),
U is at each occurrence in ligands A, B and C, identically or differently, selected from the group consisting of a phosphonic acid group, a thiol group, a thiolate group, a thioic acid group, a dithioic acid group, a mercaptoester group, a carboxylic acid group, a carboxylate group, a phosphonate group, a thiocarbamate group, a phosphine group, a phosphinoxide group, an amine group, an amide group, and a selenol group;
V is at each occurrence in ligands A, B and C, identically or differently, selected from the group consisting of a straight-chain alkylene group having 1 to 20 C atoms, or branched alkylene group having 3 to 20 C atoms, where one or more non-adjacent methylene structural units ($-CH_2-$) in said straight-chain and branched alkylene groups may in each case be replaced by a phenylene group, a sulfonyl group, a carbonyl group, an ether group, a sulfide group, a sulfoxide group, an ester group, a phosphoester group, an amide group or an imine group, or a straight-chain alkenylene group or alkynylene group having 2 to 20 C atoms or a branched alkenylene group or alkynylene group having 3 to 20 C atoms, where one or more methylene structural units ($-CH_2-$) in said straight-chain and branched alkenylene or alkynylene groups may in each case be replaced by a phenylene group, a sulfonyl group, a carbonyl group, an ether group, a sulfide group, a sulfoxide group, an ester group, a phosphoester group, an amide group or an imine group; and
X, Y and Z are independently of each other selected from the group consisting of a thiol group, an acrylate group, a styrene group, a carbonate group, and a carbamate group.

5. The optical medium according to claim 4, wherein in X, Y and Z the carbamate group is a urethane.

6. The optical medium according to claim 4, wherein in the ligand U is in Zn-carboxylate, Zn-thiocarbamate, or Zn-phosphonate.

7. The optical medium according to claim 3, wherein in the ligand group U is identical in each of the at least one organic ligand A, the at least one organic ligand B and the at least one organic ligand C and/or V is identical in each of the at least one organic ligand A, the at least one organic ligand B and the at least one organic ligand C.

8. The optical medium according to claim 3, wherein in the ligand U is a phosphonic acid group and wherein group V is a straight-chain alkylene group having 1 to 20 C atoms, where one or more non-adjacent methylene structural units ($-CH_2-$) in said straight-chain alkylene group may be replaced by a phenylene group, a sulfonyl group, a carbonyl group, an ether group, a sulfide group, a sulfoxide group, an ester group, a phosphoester group, an amide group or an imine group.

9. The optical medium according to claim 1, wherein in the ligand groups X, Y and Z are identical.

10. The optical medium according to claim 1, wherein in the nanoparticle the at least one organic ligand A, the at least one organic ligand B and the at least one organic ligand C are identical.

11. The optical medium according to claim 1, wherein in the ligand groups X, Y and Z are identically selected from the group consisting of a thiol group, an acrylate group, and a styrene group.

12. The optical medium according to claim 1, wherein in the nanoparticle the at least one organic ligand A, the at least one organic ligand B and the at least one organic ligand C are identically selected from the group consisting of 11-mercaptoundecylphosphonic acid, 11-phosphonoundecyl acylate and p-[(4-ethenylphenyl)methyl] phosphonic acid.

13. The optical medium according to claim 1, comprising at least one solvent, selected from one or more members of the group consisting of aromatic, halogenated and aliphatic hydrocarbons solvents.

14. Optical device comprising an optical medium according to claim 1.

* * * * *